United States Patent [19]

Sato

[11] 4,193,849
[45] Mar. 18, 1980

[54] METHOD FOR MAKING A RAW BOARD FOR USE IN PRINTED CIRCUITS

[75] Inventor: Junichi Sato, Yokohama, Japan

[73] Assignee: Nippon Mining Co., Ltd., Tokyo, Japan

[21] Appl. No.: 886,826

[22] Filed: Mar. 15, 1978

[30] Foreign Application Priority Data

Mar. 18, 1977 [JP] Japan .................................. 52-29241

[51] Int. Cl.² .......................... C25D 5/02; C25D 5/56; C25D 7/06
[52] U.S. Cl. .................................... 204/38 B; 204/15; 204/20
[58] Field of Search .................... 204/15, 38 B, 20, 30

[56] References Cited

U.S. PATENT DOCUMENTS

| 3,702,284 | 11/1972 | Merkenschlager | 204/15 |
| 3,901,770 | 8/1975 | Littwin | 204/15 |

OTHER PUBLICATIONS

Modern Electroplating Edited by Frederick A. Cowenheim, 1963, pp. 173–181.
Plating on Plastics, by Gerd Müller et al., 2nd Ed., (1971), pp. 22–37, 116–118.
Printed Circuit Techniques, NBS Circular 468, Issued Nov. 15, 1947, pp. 1–5, 9, 24–26.
Vacuum Deposition of Thin Films, by L. Holland, 5th Ed., (1963), pp. 44–47, 60, 358–367.

Primary Examiner—T. M. Tufariello
Attorney, Agent, or Firm—William E. Jackson

[57] ABSTRACT

There is disclosed a method of making a raw board for use in printed circuits, comprising the steps of subjecting a film of a plastic to vapor deposition with a metal and then electrochemically depositing a metal on the metal.

10 Claims, No Drawings

METHOD FOR MAKING A RAW BOARD FOR USE IN PRINTED CIRCUITS

BACKGROUND OF THE INVENTION

The present invention relates to a method of making a raw board for use in printed circuits.

The raw board for use in printed circuits have been hitherto used by heat-pressing copper foil with an adhesive on a sheet of a plastic polymer such as phenol resins, epoxy resins and the like.

In such a case, a copper foil having a thickness of at least 30μ or so have usually been employed, because in the case where an excessively thin copper foil was used, wrinkles and breaking of the copper foil are apt to effect at the stages of producing and cutting the copper foil and the foil could not be easily adhered to a substrate in desired conditions at the stage of heat-pressing the copper foil onto a plastic film.

On the contrary, in the case where the copper foil having about 30μ of thickness, is used, side etching phenominon takes place when a circuit is printed on the copper foil and copper portions other than necessary portions are dissolved to be removed by etching treatment, and there is found problems such that breaking of circuits takes place and/or a minute pattern cannot be obtained.

DESCRIPTION OF THE INVENTION

An object of the present invention is to overcome the above problems as seen in prior art and find an essential improvement of the method for producing a raw board for use in printed circuits.

According to the present invention, previous production of a metallic foil such as copper foil, as in prior arts, is not required. Also, a surface treatment or an adhesion treatment of a metallic foil, which is hitherto needed for making the metallic layer on the surface of a substrate for use in printed circuits, is not required at all. Further, according to the present invention, adhesion of a metallic layer onto a substrate for use in printed circuits may be simplified and it is also possible to make the thickness of a metallic layer ultra thin.

As a result, the side etching phenomenon as seen in an etching operation after printing a circuit can scarcely be seen. For such a reason, problems encountering in using a raw board for use in printed circuits can be eliminated.

A method according to an embodiment of the present invention comprises evaporating a metal onto a film or sheet of a flexible plastic, and then electrochemically depositing a metal on the metal.

As the insulating substrate usable in the present invention, there is a flexible film of a plastic, including sheet materials.

Illustratives of the flexible prastic film are polyvinylchloride film, polyethylene telephthalate film, polyimide film and the like, and preferably polyimide film available from duPont under the designation "KAPTON" and a polyester resin film available from duPont under the designation "MYLER".

A production method of the raw board according to the present invention will be illustrated in the sequence of the steps used hereafter.

First a plastic film is subjected to a degreasing treatment in a conventional manner such as, for example, by immersing the film in an aqueous caustic alkali solution, to remove grease content on the film, if desired. This step is not necessary if the film is perfectly clean.

Following the degreasing treatment of the foil, pretreatments of its surface to be adhered with a metal, such as cleaning, activation and the like, are carried out with a chemical treatment or a physical treatment. The chemical treatment may be conducted with an aqueous acid solution and water. The pretreatment may be omitted when the film can be obtained in clean state.

Also, the plastic film can be subjected to conventional pretreatments, for example, as disclosed in L. Holland, Vacuum Deposition of Thin Films, Chapman and Hall Ltd. (London), especially pages 44–103.

Following the pretreatments, a metal is vapor deposited on a surface of the film with a vacuum evaporation method or the like.

Preferably, a metal to be vapor deposited on the surface of the foil is a metal such as copper, nickel, tin and the like, which has superior conductivity and adhesiveness to the foil and is relatively easy to be dissolved and removed upon being etched.

The vapor deposition may be carried out by using aforesaid metal alone or as an alloy including Cu-Zn alloy. Further, separated metals or an alloy of at least two kinds of metals as mentioned above may be deposited in two layers. As a result, a decrease of the adhesion strength between the metal and the film, and formation of an oxidation coating effected by the metals may be avoided. An effective adhesion between the metals and a metal subsequently used may be obtained.

The thickness of a metal layer to be vapor deposited is above about 0.05μ, and preferably 0.1–0.3μ. The thickness is of such a degree that the layer serves as an electric conductor in the subsequent electrodepositing step carried out by an electroplating method or the like, which will be later described.

In the electrical metal-depositing treatment, the U.B.A.C. and preferably the brightener U.B.A.C. #1 (Trade Name) which is available from Udylite Div., OMIC can be used as an additive, and the electrolytic metal-depositing treatment increases the thickness of the metal layer previously existing on the film to about 1–10μ or so. An electrolyte temperature ranges preferably between about 40°–70° C. and for best results about 50°–60° C. in case of use of the U.B.A.C. #1 in the electrolyte.

The metal to be electrochemically deposited may be copper alone or an alloy of copper and at least one metal selected from nickel, tine and zinc.

In case of electrochemically depositing the metal on the surface of a metal layer previously vapor deposited, the metal may be used alone or as an alloy and it may also be deposited in a single layer or double layers.

The metal layer thus formed may have optional thickness required for a raw board for use in printed circuits.

Passing through these steps, the raw board made according to the present invention may be obtained. A printed circuits board is made by printing a required circuit on the raw board thus obtained and dissolving and removing unnecessary portions of the metal layer by an etching operation in a conventional manner.

According to the present invention, continuous production of the long raw film for use in printed circuits is possible. by using a roll of a flexible film.

The following examples further illustrate preferred operations within the scope of the present invention.

EXAMPLE 1

In this example, "KAPTON" available from duPont which was a flexible film of 300 mm in width, 400 m in length and 50μ in thickness, was used. The film was immersed in 10% aqueous NaOH solution for 5 minutes at 70° C. and then washed to degrease same. Thereafter it was air dried for one minute at 180° C.

The film thus treated was subjected to copper vapor depositing treatment using sputtering method until the thickness of the deposited copper layer became to 0.1μ.

The deposited copper layer obtained was used as a cathode in the subsequent electroplating step.

In the electroplating treatment, pure copper plate was used as an anode to carry out the electroplating treatment using the following conditions;
HCl: 20 mg/l
Cathode current density: 1.6 A/dm$^2$
Temperature: 55° C.
$CuSO_4.5H_2O$ concentration (gms/liter): 225
Acid concentration in terms of $H_2SO_4$ (gms/liter): 50
Brightener Additive (U.B.A.C. #1 ml/liter): 4

The foil so treated had 10μ of thickness in the copper layer deposited and 1.6 kg/cm of peeling strength in a peeling test.

EXAMPLE 2

In the same manner as described in example 1, prolyethylene telephthalate film in roll form of 500 mm in width, 200 m in length and 38μ in thickness is treated under the following conditions;
HCl (mg/l): 20
Cathode current density (A/dm$^2$): 2.0
Temperature (°C.): 60
$CuSo_4.5H_2O$ (gms/liter): 200
Acid concentration in terms of $H_2SO_4$ (gms/liter): 45
Brightener Additive (U.B.A.C. #1) ml/liter: 5

The thus treated foil has 12μ of thickness in the deposited Cu layer and 1.5 kg/cm of peel strength in a peeling test.

In addition to the results of the foregoing examples, there can scarcely be found pin holes although the deposited layer is extremely thin, because a metal is directly vapor-deposited onto an insulating substrate and a metal has been electrochemically deposited on a metal surface vapor deposited thereon to make a raw board for use in printed circuits. For example, the following results may be obtained.

(1) It is not needed to adhere a metallic foil onto a substrate.
(2) Continuous production is possible in case of using a long film in roll form. For example, a board with 100-2000 m film can be continuously produced.
(3) Circuits having high reliability may be obtained because there is scarcely found pin holes on the surface of the metal vapor deposited onto a clean substrate.
(4) The thickness of the metallic layer may be optionally selected because the layer is formed by an electrochemical method.
(5) In the case where an extremely thin metallic layer is used, the etching operation is easily carried out and there scarcely be found side etching phenomenon to enable man to make a precise and minute circuit.
(6) Troubles such as pits, dents, scratches, stain and the like which arise during the period of handling the product do not take place and the product can effectively be used with extremely thin thickness because an adhesion treatment of a metallic foil or a treatment for the adhesion of same is not required.

The invention may be embodoied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What I claim is:

1. A method for making a raw board for use in printed circuits, comprising the steps of subjecting a very long film of a flexible plastic which can be easily rolled into a roll form to vapor deposition with a metal so as to vapor-deposit the metal directly onto the surface of the flexible film, and continuously immersing the flexible film in an electrochemical bath including as an additive a brightener which has its brightening effect only at a temperature between about 15° to 30° C., said bath being kept at a temperature between 50°-60° C. where said brightener has no brightening effect so that a metal is continuously electroplated on the surface of the metal previously vapor-deposited on the surface of the flexible film thereby to produce a flexible raw board for use in printed circuits with the raw board having approximately 1.5 kg/cm of peel strength.

2. The method of claim 1 wherein said plastic is selected from the group consisting of polyvinyl chloride, polyethylene telephthalate and polyimide.

3. The method of claim 1 wherein said metal to be vapor-deposited on said film is selected from the group consisting of Cu, Ni, Sn, an alloy thereof and a Cu-Zn alloy.

4. The method of claim 1 wherein said metal is used alone.

5. The method of claim 3 wherein said metal is used in a combination of at least two metals.

6. The method of claim 1 wherein said metal to be electro-chemically deposited on the surface of said vapor-deposited metal is at least one metal selected from the group consisting of Cu, Ni, Sn, Zn and an alloy thereof.

7. The method of claim 1 wherein said film is at least 200 m.

8. A method for making a flexible laminate of plastic and copper for use in printed circuits, comprising:
 (a) subjecting a flexible plastic film to vapor deposition with copper so as to vapor-deposit a first layer of copper directly onto the surface of said film, said film being about 40 to 50μ in thickness and said first layer of copper being about 0.1μ to 0.3μ in thickness;
 (b) immersing said film and first copper layer into an electrochemical copper plating bath including a brightener as an additive, said bath being at a temperature of about 50° to 60° C., and plating a second layer of copper of about 10μ to 12μ in thickness onto said first copper layer, said copper layers having approximately 1.5 kg/cm of peel strength from said flexible plastic film.

9. A flexible raw board for use in printed circuits as produced by the method of claim 1.

10. A flexible raw board for use in printed circuits as produced by the method of claim 8.

* * * * *